US011841296B2

(12) United States Patent
Montaque et al.

(10) Patent No.: US 11,841,296 B2
(45) Date of Patent: Dec. 12, 2023

(54) SEMICONDUCTOR SUBSTRATES FOR ELECTRICAL RESISTIVITY MEASUREMENTS

(71) Applicant: GlobalFoundries U.S. Inc., Malta, NY (US)

(72) Inventors: Marvin Montaque, Burlington, VT (US); Cathryn Christiansen, Richmond, VT (US); Katherine Niles, Greensboro, NC (US); Timothy Kemerer, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/457,426

(22) Filed: Dec. 2, 2021

(65) Prior Publication Data

US 2023/0175995 A1 Jun. 8, 2023

(51) Int. Cl.

*G01R 31/28* (2006.01)
*G01N 27/04* (2006.01)
*H01L 21/66* (2006.01)

(52) U.S. Cl.

CPC ....... *G01N 27/041* (2013.01); *G01R 31/2831* (2013.01); *H01L 22/14* (2013.01)

(58) Field of Classification Search

CPC ... G01N 27/041; G01R 31/2831; H01L 22/14
USPC .......................................................... 324/525
See application file for complete search history.

(56) References Cited

U.S. PATENT DOCUMENTS

| | | | | |
|---|---|---|---|---|
| 5,217,907 | A | 6/1993 | Bulucea et al. | |
| 6,302,769 | B1 | 10/2001 | Nishi et al. | |
| 2006/0038260 | A1* | 2/2006 | Nemoto | H01L 21/6835 257/E29.022 |
| 2007/0228522 | A1* | 10/2007 | Kamiyama | H01L 21/76243 257/618 |
| 2007/0249073 | A1* | 10/2007 | Hillard | H01L 22/14 257/E21.531 |
| 2015/0168326 | A1 | 6/2015 | Allibert | |
| 2019/0345635 | A1* | 11/2019 | Vogel | H01L 21/02021 |

FOREIGN PATENT DOCUMENTS

| | | |
|---|---|---|
| CN | 102042798 A1 | 5/2012 |
| DE | 273111 | 11/1989 |
| EP | 0950466 A2 | 10/1999 |

OTHER PUBLICATIONS

Brennan et al., Determination of Diffusion Characteristics Using Two- and Four-Point Probe Measurements, Solecon Labs Technical Note, pp. 1-10, Solecon.

* cited by examiner

*Primary Examiner* — Jermele M Hollington
*Assistant Examiner* — Courtney G McDonnough
(74) *Attorney, Agent, or Firm* — David Cain

(57) ABSTRACT

A substrate is provided. The substrate includes a front region having a front surface, a back region having a back surface, an edge exclusion region, and a chamfered surface. The back surface is laterally opposite the front surface. The edge exclusion region is surrounding the front region. The chamfered surface is at least partially arranged in the edge exclusion region.

17 Claims, 4 Drawing Sheets

100
108
102
102S
110
B
B'
112S
106
106L
A
A'
100
106
114S
114
102S
102
116S
116
T
108
120
104S
104
118
118S
120S
106L

SEMICONDUCTOR SUBSTRATES FOR ELECTRICAL RESISTIVITY MEASUREMENTS

TECHNICAL FIELD

The present disclosure relates generally to the electrical testing of semiconductor substrates, and more particularly to semiconductor substrates for electrical resistivity measurements and methods of processing the same.

BACKGROUND

Semiconductor substrates may affect the performance of semiconductor devices formed thereon. For example, a semiconductor substrate having a high electrical resistivity may minimize the generation of parasitic signals, such as harmonics, for radio frequency (RF) devices. It is important to keep harmonic levels sufficiently low to ensure high fidelity of an output signal of an RF device.

Therefore, in order to minimize harmonics in RF devices, it is critical to verify the electrical resistivity of a semiconductor substrate before starting the fabrication process. The electrical resistivity of a semiconductor substrate generally varies as a function of depth under the surface thereof, and a semiconductor substrate sample may be prepared by forming a bevel through the semiconductor substrate sample and measuring the electrical resistance with respect to the depth. The electrical resistivity of the semiconductor substrate sample at the measurement depth may be deduced from this electrical resistance measurement and an electrical resistivity depth profile may be obtained.

However, forming the bevel through the semiconductor substrate sample is destructive and renders the semiconductor substrate unsuitable for further use, thereby increasing manufacturing costs and waste. Therefore, semiconductor substrates for electrical resistivity measurements are provided to overcome, or at least ameliorate, the disadvantages described above.

SUMMARY

To achieve the foregoing and other aspects of the present disclosure, semiconductor substrates for electrical resistivity measurements and methods of processing the same are presented.

According to an aspect of the present disclosure, a substrate is provided. The substrate includes a front region having a front surface, a back region having a back surface, an edge exclusion region, and a chamfered surface. The back surface is laterally opposite the front surface. The edge exclusion region is surrounding the front region. The chamfered surface is at least partially arranged in the edge exclusion region.

According to another aspect of the present disclosure, a substrate is provided. The substrate includes a front region having a front surface, a back region having a back surface, an edge exclusion region, and a chamfered surface. The back surface is laterally opposite the front surface. The edge exclusion region is surrounding the front region and includes an edge. The chamfered surface is at least partially arranged in the edge exclusion region and the chamfered surface extends towards the edge from a plane substantially coplanar with the front surface and forms an acute angle with the plane substantially coplanar with the front surface.

According to yet another aspect of the present disclosure, a method of processing a substrate is provided. The method includes forming a chamfered surface in an edge exclusion region of the substrate. The chamfered surface extends towards an edge of the substrate from a plane substantially coplanar with a front surface of the substrate to a depth under the front surface.

BRIEF DESCRIPTION OF THE DRAWINGS

The embodiments of the present disclosure will be better understood from a reading of the following detailed description, taken in conjunction with the accompanying drawings.

Figure 1A:
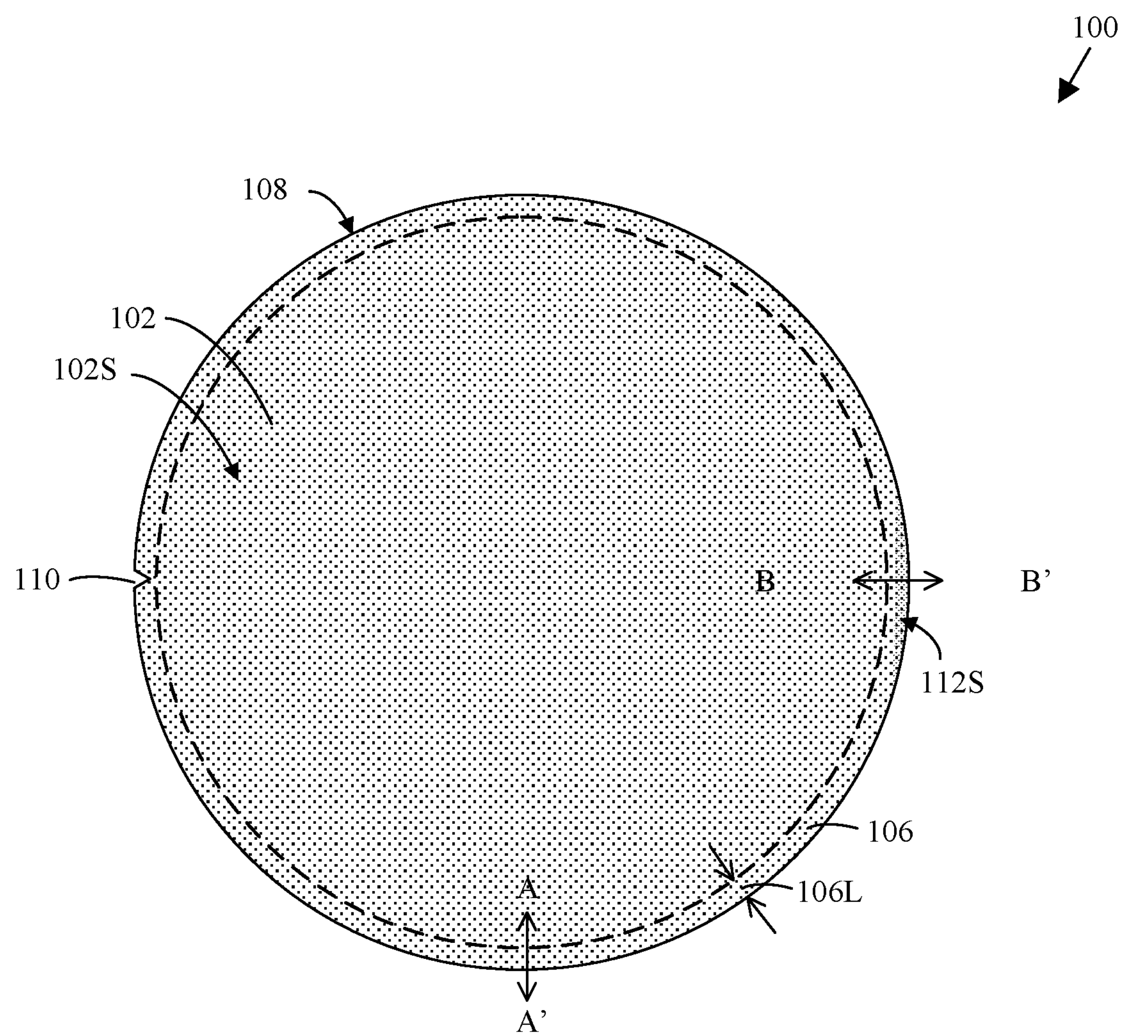
FIG. 1A is a top view of a semiconductor substrate, according to an embodiment of the disclosure.

For simplicity and clarity of illustration, the drawings illustrate the general manner of construction, and certain descriptions and details of features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates to semiconductor substrates for electrical resistivity measurements and methods of processing the same. The electrical resistivity measurement may be performed to determine the electrical resistivity of a semiconductor substrate and may be performed before starting the fabrication process to form semiconductor devices thereon. The electrical resistivity measurement may be a non-destructive measurement that does not render the semiconductor substrate unsuitable for further use. After performing the electrical resistivity measurement, the semiconductor substrate may proceed to form semiconductor devices thereon.

The semiconductor substrate may include a variety of configurations, such as a bulk semiconductor material or a composite material, for example, a semiconductor-on-insulator (SOI) substrate having a single crystalline semiconductor material, a buried insulator layer under the single crystalline semiconductor material, and a carrier substrate under the buried insulator layer. The semiconductor substrate may include any suitable semiconductor material, such as silicon, silicon germanium, silicon carbon, other II-VI or III-V semiconductor compounds, and the like. The terms “semiconductor substrate” and “substrate” may be used interchangeably and may include semiconductor substrates having a diameter of 200 mm, 300 mm, or 450 mm.

However, the present disclosure is not limited to the listed diameters and the semiconductor substrates can have various shapes, sizes, and materials.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

Figure 1B:
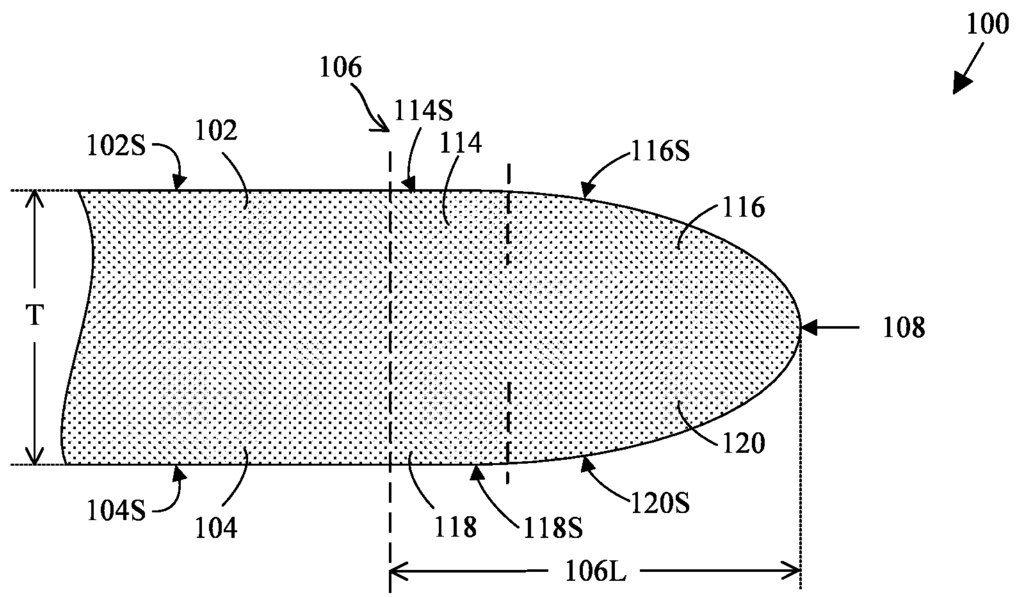
FIG. 1B is a cross-sectional view across a line A-A' of a portion of the semiconductor substrate in FIG. 1A, according to an embodiment of the disclosure.
Figure 1C:
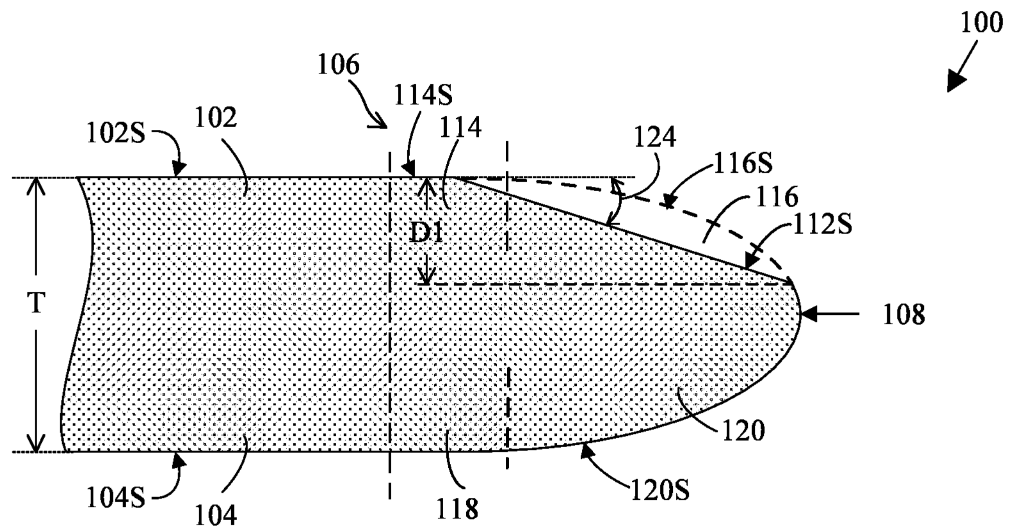
FIG. 1C is a cross-sectional view across a line B-B' of another portion of the semiconductor substrate in FIG. 1A, according to an embodiment of the disclosure.

FIG. 1A is a top view of a semiconductor substrate 100, FIG. 1B is a cross-sectional view across a line A-A' of a portion of the semiconductor substrate 100 in FIG. 1A, and FIG. 1C is a cross-sectional view across a line B-B' of another portion of the semiconductor substrate 100 in FIG. 1A, according to an embodiment of the disclosure.

The semiconductor substrate 100 may include a front region 102 having a front surface 102S. The front surface 102S is generally where semiconductor devices (not shown) are subsequently formed thereon. The semiconductor devices may include active devices, such as transistors, memory arrays, logic, and the like, and may also include passive devices, such as capacitors, inductors, transformers, and the like. The semiconductor substrate 100 may further include a back region 104 having a back surface 104S; the back surface 104S is laterally opposite and substantially parallel to the front surface 102S, as illustrated in FIGS. 1B and 1C. The back surface 104S is generally where no active semiconductor devices are formed thereon. The semiconductor substrate 100 may have a thickness T that corresponds to a distance between the front surface 102S and the back surface 104S, as illustrated in FIGS. 1B and 1C.

The semiconductor substrate 100 may yet further include an edge exclusion region 106. The edge exclusion region 106 may include an edge 108, an orientation feature 110, and a chamfered surface 112S. The edge exclusion region 106 may peripherally surround the front region 102 and the back region 104. The edge exclusion region 106 may be a region where no part of a semiconductor device may be formed thereon due to the proximity to the edge 108; the edge exclusion region 106 is arbitrarily demarcated from the front surface 102S by a dashed line, as illustrated in FIG. 1A. In an embodiment of the disclosure, the edge exclusion region 106 may have a length 106L of about 2 mm to about 5 mm from the edge 108 towards a center of the semiconductor substrate 100. In another embodiment of the disclosure, the front surface 102F may be spaced from the edge 108 from about 2 mm to about 5 mm from the edge 108 of the semiconductor substrate 100.

The edge 108 may correspond to the peripheral edge of the semiconductor substrate 100 that determines the shape thereof. The orientation feature 110 may extend from the edge 108 towards the center of the semiconductor substrate 100. The orientation feature 110 may provide positioning precision to align the semiconductor substrate 100 in a repeatable orientation during each step of the subsequent fabrication process. The orientation feature 110 may include a flat or a notch, and FIG. 1A illustrates a notch.

The chamfered surface 112S may be suitable for performing an electrical resistivity measurement thereon. Even though the chamfered surface 112S is illustrated as being arranged opposite the orientation feature 110 in FIG. 1A, the chamfered surface 112S may be arranged at any location in the edge exclusion region 106 of the semiconductor substrate 100.

Referring to FIG. 1B, the edge exclusion region 106 of the semiconductor substrate 100 may include a plurality of regions, such as an upper intermediate region 114 having an upper intermediate surface 114S and an upper edge region 116 having an upper edge surface 116S. The upper intermediate region 114 may be arranged between the front region 102 and the upper edge region 116. The front surface 102S, the upper intermediate surface 114S, and the upper edge surface 116S may form a contiguous surface that terminates at the edge 108. The upper intermediate surface 114S may be substantially coplanar with the front surface 102S and is demarcated from the upper edge region 116 by an arbitrary dashed-dot line. The upper edge surface 116S may be an inwardly curved surface that extends towards the back region 104.

The edge exclusion region 106 may further include a lower intermediate region 118 having a lower intermediate surface 118S and a lower edge region 120 having a lower edge surface 120S. The lower intermediate region 118 may be arranged between the back region 104 and the lower edge region 120. The back surface 104S, the lower intermediate surface 118S, and the lower edge surface 120S may form a contiguous surface that terminates at the edge 108. The lower intermediate surface 118S may be substantially coplanar with the back surface 104S and is demarcated from the lower edge region 120 by an arbitrary dashed-dot line. The lower edge surface 120S may be an inwardly curved surface that extends towards the front region 102, and the lower edge surface 120S may connect with the upper edge surface 116S at the edge 108.

Referring to FIG. 1C, the chamfered surface 112S may be arranged in the edge exclusion region 106 proximate to the front region 102. The chamfered surface 112S may be at least arranged in the upper edge region 116. For example, the chamfered surface 112S may start from a plane substantially coplanar with the front surface 102S, such as the upper intermediate surface 114S, and extends towards the edge 108 to a depth D1 under the upper edge surface 116S. In another example, the chamfered surface 112S may start from the front surface 102S and extends towards the edge 108 to a depth under the upper edge surface 116S, even though this embodiment is not shown in the accompanying drawings. The chamfered surface 112S may terminate on the upper edge surface 116S, as illustrated in FIG. 1C, or on the edge 108, and may not extend to the lower edge surface 120S. In an embodiment of the disclosure, the chamfered surface 112S may be substantially planar.

In an embodiment of the disclosure, where the semiconductor substrate 100 includes a composite material, such as an SOI substrate, the chamfered surface 112S may extend to the carrier substrate, i.e., under the buried insulator layer, even though this embodiment is not illustrated in the accompanying drawings.

The chamfered surface 112S may further form an angle 124 with the plane substantially coplanar with the front surface 102S of the semiconductor substrate 100, for example, the angle 124 may be formed between the upper intermediate surface 114S and the chamfered surface 112S. In an embodiment of the disclosure, the angle 124 may be acute. In another embodiment of the disclosure, the angle 124 may range from about 0.5 degrees to about 11.5 degrees.

The electrical resistivity of a semiconductor substrate generally varies as a function of depth, and the depth of interest may be at a depth where the semiconductor devices function. For example, the depth of interest may be where the electric fields of the semiconductor devices penetrate the semiconductor substrate 100 and influence the charge carriers therewithin. Therefore, the depth of interest of the semiconductor substrate 100 may be dependent on the technology node and design requirements of the semiconductor devices formed thereon. In an embodiment of the disclosure, the depth D1 may be at most about 0.1 mm.

The chamfered surface 112S may be formed by performing a material removal technique over the edge exclusion region 106 of the semiconductor substrate 100. The material removal technique may include a grinding process. An exemplary grinding process is described herein. The grinding process may include a grindstone. The semiconductor substrate 100 may be held stationary and the grindstone may be rotated and placed against a surface of the semiconductor substrate 100 to remove substrate material therefrom, such as from the upper intermediate region 114 and the upper edge region 116; the portion of the semiconductor substrate removed is demarcated by a dotted line in FIG. 1C.

The chamfered surface 112S may be suitable for performing an electrical resistivity measurement on the semiconductor substrate 100. One method of performing such an electrical resistivity measurement is using a probe system to perform a spreading resistance probe (SRP) measurement. The probe system will provide electrical resistivity versus depth profiles of the semiconductor substrate and an exemplary method of performing an SRP measurement is described herein.

The probe system (not shown) may include two or more probe tips. Each probe tip may be mounted on the end of an arm and the probe tips may be placed substantially close together, for example, at 0.02 mm or less. To perform an SRP measurement, the probe tips are lowered onto the chamfered surface 112S. A voltage may be applied across the probe tips, for example, 5 mV, and the current flowing through the probe system is measured. The resistance, also referred to as spreading resistance, may then be calculated. The resistance measured is immediately under the probe tips and by probing across the measurement surface, an electrical resistivity versus depth profile may be obtained.

Due to the small contact area of each probe tip, the pressure exerted onto the chamfered surface 112S may be significantly high, forming probe marks on the chamfered surface 112S. The probe marks may render the area of the semiconductor substrate 100 unusable. As the chamfered surface 112S may be arranged in the edge exclusion region 106, the formation of the probe marks on the chamfered surface 112S does not render the semiconductor substrate 100 unusable for further processing, and the semiconductor substrate 100 may proceed to form semiconductor devices on the front surface 102S.

Figure 2:
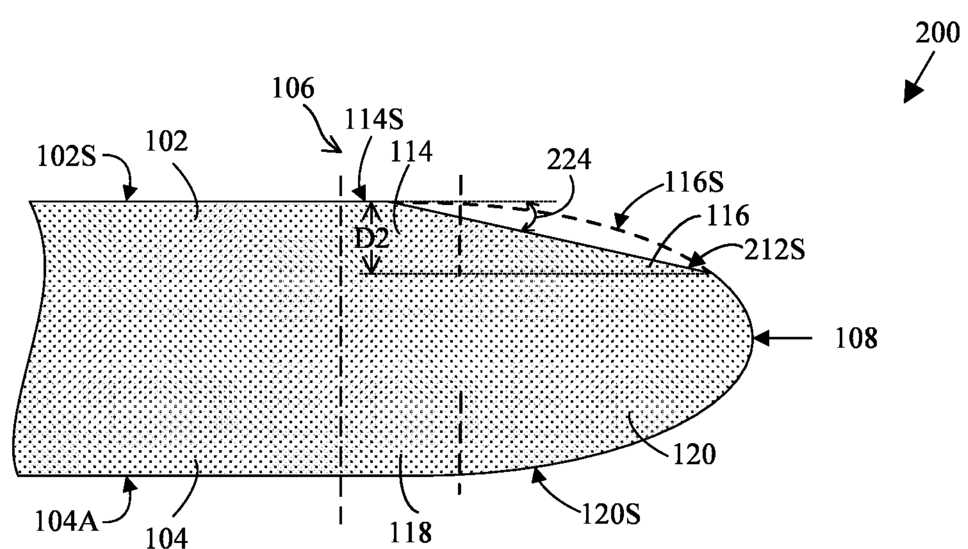
FIG. 2 is a cross-sectional view across a portion of a semiconductor substrate, according to an alternative embodiment of the disclosure.

FIG. 2 is a cross-sectional view of a portion of a semiconductor substrate 200, according to another embodiment of the disclosure. The portion of the semiconductor substrate 200 may be similar to the portion of the semiconductor substrate 100 in FIG. 1C, and thus common features are labeled with the same reference numerals and need not be discussed. For example, the semiconductor substrate 200 may include a front region 102 having a front surface 102S, a back region 104 having a back surface 104S, and an edge exclusion region 106 having an edge 108. The edge exclusion region 106 may further include an upper intermediate region 114 having an upper intermediate surface 114S and an upper edge region 116 having an upper edge surface 116S.

The semiconductor substrate 200 may include a chamfered surface 212S arranged in the edge exclusion region 106 proximate to the front region 102. The chamfered surface 212S may extend from a plane substantially coplanar with the front surface 102S, such as the upper intermediate surface 114S, towards the edge 108 to a depth D2 under the upper edge surface 116S. The depth D2 may be shallower than the depth D1 in FIG. 1C. Similar to the chamfered surface 112S in FIG. 1C, the chamfered surface 112S may terminate on the upper edge surface 116S or on the edge 108, and may not extend to the lower edge surface 120S.

The chamfered surface 212S may form an angle 224 with the plane substantially coplanar with the front surface 102S and may include a gentler gradient, i.e., the angle 224 may be shallower than the angle 124 in FIG. 1C. Accordingly, the chamfered surface 212S may provide a more sensitive electrical resistivity profile as compared to the chamfered surface 112S of the semiconductor substrate 100 in FIG. 1C due to the gentler gradient. However, the angle 224 may be the same or wider than the angle 124 in FIG. 1C and the angle 124/224 may be dependent on, for example, the electrical resistivity depth of interest or the extent of the permissible area for the chamfered surface 112S/212S.

Even though FIGS. 1C and 2 illustrate the chamfered surfaces 112S and 212S, respectively, as arranged in the edge exclusion region 106, the chamfered surfaces 112S and 212S may not necessarily be arranged entirely therein. For example, the chamfered surface 112S/212S may exceed beyond the edge exclusion region 106 and extend into the front surface 102S, such as a portion of the chamfered surface 112S/212S may be arranged in the front region 102. The chamfered surface 112S/212S may thereby minimize the usable area on the front surface 102S for the fabrication of semiconductor devices, however, still renders the semiconductor substrate 100 usable.

Figure 3:
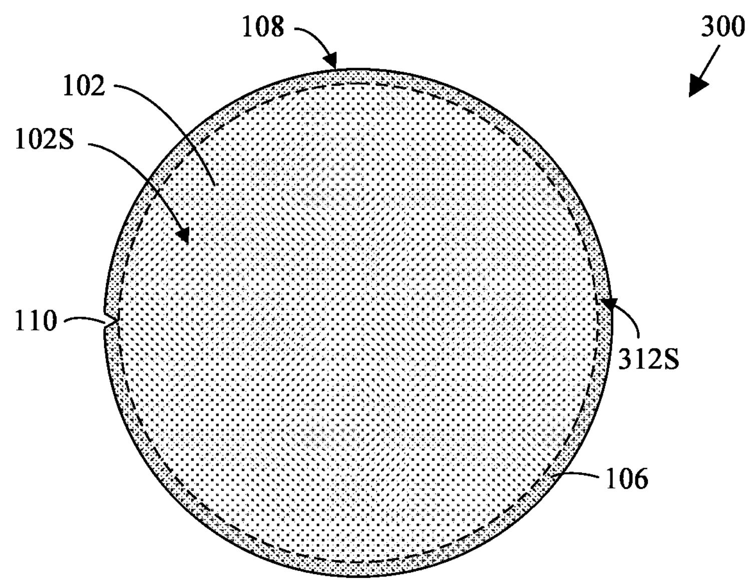
FIG. 3 is a top view of a semiconductor substrate, according to another embodiment of the disclosure.

FIG. 3 is a top view of a semiconductor substrate 300, according to another embodiment of the disclosure. The semiconductor substrate 300 may be similar to the semiconductor substrate 100 in FIG. 1A, and thus common features are labeled with the same reference numerals and need not be discussed. For example, the semiconductor substrate 300 may include a front region 102 having a front surface 102S and an edge exclusion region 106 peripherally surrounding the front region 102.

The semiconductor substrate 300 may include a chamfered surface 312S arranged in the edge exclusion region 106. However, unlike the chamfered surface 112S of the semiconductor substrate 100 in FIG. 1A, the chamfered surface 312S may peripherally surround the front region 102 of the semiconductor substrate 300. The chamfered surface 312S may form an acute angle (not shown) with a plane substantially coplanar with the front surface 102S, similar to the angle 124 in FIG. 1C or the angle 224 in FIG. 2. The chamfered surface 312S may be at least arranged in the upper edge region of the edge exclusion region 106, similar to the chamfered surfaces 112S and 212S in FIGS. 1C and 2, respectively. In an embodiment of the disclosure, the acute angle between the front surface 102S and the chamfered surface 312S may be substantially uniform.

The chamfered surface 312S advantageously enables an electrical resistivity measurement to be performed at multiple regions of the edge exclusion region 106 and besides determining the electrical resistivity of the semiconductor substrate 300, the uniformity of the electrical resistivity of the semiconductor substrate 300 may be also determined.

Figure 4:
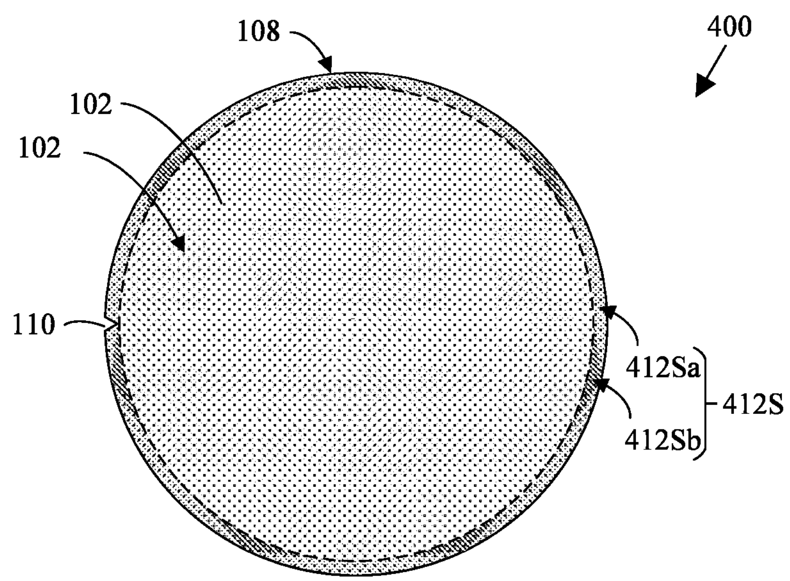
FIG. 4 is a top view of a semiconductor substrate, according to yet another embodiment of the disclosure.

FIG. 4 is a top view of a semiconductor substrate 400, according to yet another embodiment of the disclosure. The semiconductor substrate 400 may be similar to the semiconductor substrate 300 in FIG. 3, and thus common features are labeled with the same reference numerals and need not be discussed. For example, the semiconductor substrate 400 may include a front region 102 having a front surface 102S and an edge exclusion region 106 peripherally surrounding the front region 102.

The semiconductor substrate 400 may include a chamfered surface 412S arranged in the edge exclusion region 106, and the chamfered surface 412S may peripherally surround the front region 102 of the semiconductor substrate 400. However, unlike the chamfered surface 312S of the semiconductor substrate 300 in FIG. 3, the chamfered surface 412S may include multiple acute angles formed between a plane substantially coplanar with the front surface 102S and the chamfered surface 412S. For example, the chamfered surface 412S may include a first acute angle formed between the plane substantially coplanar with the front surface 102S and a portion of chamfered surface 412Sa and a second acute angle formed between the plane substantially coplanar with the front surface 102S and another portion of the chamfered surface 412Sb. The first acute angle may be different from the second acute angle, for example, the first acute angle may be wider or shallower than the second acute angle. In another example, the first acute angle may be wider than the second angle, similar to the angle 124 in FIG. 1C being wider than the angle 224 in FIG. 2. In yet another example, the first acute angle may be shallower than the second angle, similar to the angle 224 in FIG. 2 being shallower than the angle 124 in FIG. 1C.

The chamfered surface 412S may advantageously enable an electrical resistivity measurement to be performed at multiple regions of the edge exclusion region 106 and besides determining the electrical resistivity of the semiconductor substrate 400, the chamfered surface 412S may further provide information regarding the uniformity of the electrical resistivity of the semiconductor substrate 400, as well as different sensitivities of electrical resistivity profiles, for example, a shallower angle may provide a more sensitive electrical resistivity profile as compared to that a wider angle.

As presented in the above disclosure, various embodiments of semiconductor substrates for non-destructive electrical resistivity measurements are presented. The semiconductor substrate may include a chamfered surface at least partially arranged in an edge exclusion region and may form an acute angle with a plane substantially coplanar with a front surface of the semiconductor substrate. The electrical resistivity of a semiconductor substrate may be determined by performing a non-destructive electrical resistivity measurement on the chamfered surface. Those semiconductor substrates whose electrical resistivity depth profiles are found to be suitable for the fabrication of semiconductor devices may then proceed on to the semiconductor device fabrication process.

The various embodiments of semiconductor substrates presented may enable semiconductor devices manufacturers to perform electrical resistivity measurements to verify the electrical resistivities of the semiconductor substrates before the fabrication process. The electrical resistivity measurements are non-destructive as the measurements are performed on edge exclusion regions of the semiconductor substrates, thereby reducing the generation of waste and avoiding unnecessary manufacturing costs. Additionally, the non-destructive electrical resistivity measurements may enable semiconductor devices manufacturers to verify a larger sample size, if not all, of the electrical resistivities of the semiconductor substrates, and gain confidence that the performance of the semiconductor devices may not be affected by a semiconductor substrate having unsatisfactory characteristics.

The terms "upper", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about,", "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of ninety degrees plus or minus a normal tolerance of the semiconductor industry.

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A substrate, comprising:

a front region having a front surface;

a back region having a back surface, the back surface is opposite the front surface; and an edge exclusion region surrounding the front region, wherein the edge exclusion region comprises a curved surface and a chamfered surface, the curved surface is arranged around the chamfered surface, wherein the curved surface contiguously connects the front surface and the back surface directly and further directly connects the back surface to the chamfered surface, wherein the edge exclusion region includes a peripheral portion, and the chamfered surface is located at one section of the peripheral portion which does not extend around the full circumference of the edge exclusion region.

2. The substrate of claim 1, wherein the edge exclusion region includes a peripheral portion, and the chamfered surface is located at one section of the peripheral portion.

3. The substrate of claim 1, wherein the chamfered surface is arranged proximate to the front surface.

4. The substrate of claim 1, wherein the edge exclusion region further comprises:

an upper intermediate region having an upper intermediate surface, the upper intermediate surface is substantially coplanar with the front surface; and an upper edge region adjacent to the upper intermediate region, the upper edge region having an upper edge surface inwardly curved towards the back surface, and the chamfered surface is at least arranged in the upper edge region.

5. The substrate of claim 4, wherein a portion of the chamfered surface is arranged in the upper intermediate region.

6. The substrate of claim 4, wherein the chamfered surface terminates on the upper edge surface.

7. The substrate of claim 4, wherein the edge exclusion region further comprising an edge, and the chamfered surface terminates on the edge.

8. The substrate of claim 4, wherein the chamfered surface extends to a depth under the upper edge surface.

9. The substrate of claim 8, wherein the depth is at most 0.1 mm.

10. The substrate of claim 1, wherein the chamfered surface forms an acute angle with a plane substantially coplanar with the front surface.

11. The substrate of claim 10, wherein the chamfered surface forms an angle of about 0.5 degrees to about 11.5 degrees.

12. The substrate of claim 1, wherein the chamfered surface is a surface for performing an electrical resistivity measurement on the substrate.

13. A substrate, comprising:

a front region having a front surface;

a back region having a back surface; the back surface is opposite the front surface; and an edge exclusion region surrounding the front region, the edge exclusion region comprises: an edge; a curved surface contiguously connecting the front surface and the back surface directly through the edge; and a chamfered surface, the curved surface is arranged around the chamfered surface and the chamfered surface is located at one section of the curved surface which does not extend around the full circumference of the curved surface and extends towards the edge from a plane substantially coplanar with the front surface and forms an acute angle with the plane substantially coplanar with the front surface, and the chamfered surface is directly connected to the back surface through the curved surface.

14. The substrate of claim 13, wherein the chamfered surface forms a substantially uniform angle with the plane substantially coplanar with the front surface.

15. The substrate of claim 13, wherein the substrate comprises a bulk semiconductor material.

16. The substrate of claim 13, wherein the substrate comprises:

a single crystalline semiconductor material having the front surface;

a buried insulator layer under the single crystalline semiconductor material; and a carrier substrate having the back surface under the buried insulator layer, and the chamfered surface extends from the front surface of the single crystalline semiconductor material to the carrier substrate.

17. A method of processing a substrate, comprising:

forming a chamfered surface from a section of a curved surface of an edge exclusion region of the substrate, the curved surface is arranged around the chamfered surface and contiguously connects a front surface and a back surface of the substrate directly and further directly connects the back surface to the chamfered surface, wherein the chamfered surface extends towards an edge of the substrate from a plane substantially coplanar with the front surface to a depth under the front surface, and wherein the chamfered surface does not extend around the full circumference of the curved surface.

* * * * *